(12) United States Patent
Zhang et al.

(10) Patent No.: US 10,976,351 B2
(45) Date of Patent: Apr. 13, 2021

(54) CURRENT MONITORING DEVICE

(71) Applicant: NXP B.V., Eindhoven (NL)

(72) Inventors: Xu Zhang, Chandler, AZ (US); Siamak Delshadpour, Phoenix, AZ (US); Ahmad Yazdi, Chandler, AZ (US)

(73) Assignee: NXP B.V., Eindhoven (NL)

( * ) Notice: Subject to any disclaimer, the term of this patent is extended or adjusted under 35 U.S.C. 154(b) by 157 days.

(21) Appl. No.: 16/273,230

(22) Filed: Feb. 12, 2019

(65) Prior Publication Data
US 2020/0256894 A1 Aug. 13, 2020

(51) Int. Cl.
| | | |
|---|---|---|
| *G01R 15/14* | (2006.01) | |
| *G01R 19/165* | (2006.01) | |
| *G01R 19/25* | (2006.01) | |
| *G01R 27/08* | (2006.01) | |
| *G01R 27/16* | (2006.01) | |

(52) U.S. Cl.
CPC ..... *G01R 15/146* (2013.01); *G01R 19/16528* (2013.01); *G01R 19/2513* (2013.01); *G01R 27/08* (2013.01); *G01R 27/16* (2013.01)

(58) Field of Classification Search
None
See application file for complete search history.

(56) References Cited

U.S. PATENT DOCUMENTS

| | | | | |
|---|---|---|---|---|
| 5,793,589 A | * | 8/1998 | Friedl | .................... H02H 9/025 361/58 |
| 6,617,838 B1 | | 9/2003 | Miranda et al. | |
| 9,678,111 B2 | | 6/2017 | Liu et al. | |
| 9,715,271 B2 | * | 7/2017 | Kaestner | ................. G06F 1/266 |
| 2006/0249822 A1 | * | 11/2006 | DeBeer | .................. G01R 1/203 257/673 |
| 2007/0194795 A1 | | 8/2007 | Amanuma et al. | |
| 2015/0309090 A1 | | 10/2015 | Akahane | |
| 2018/0301174 A1 | | 10/2018 | Arno | |

FOREIGN PATENT DOCUMENTS

WO   WO-2017/149359 A1   9/2017

OTHER PUBLICATIONS

Dake, Tuli et al; "A Precision High-Voltage Current Sensing Circuit"; IEEE Transactions on Circuits and Systems I, Regular Papers, vol. 55, No. 5; pp. 1197-202 (Jun. 2008).

* cited by examiner

*Primary Examiner* — Paresh Patel

(57) ABSTRACT

One example discloses a current monitoring device, including: a sense impedance configured to receive a current to be monitored; an impedance divider, coupled to the sense impedance, and configured to convert the current to be monitored to a differential voltage to be monitored; a reference circuit configured to generate a differential reference voltage; a comparator coupled to the impedance divider and the reference circuit and configured to output a signal if the differential voltage to be monitored is different than the differential reference voltage; and wherein the reference circuit includes a comparator trimming circuit configured to vary the differential reference voltage to compensate for offset biases in the comparator.

20 Claims, 4 Drawing Sheets

CURRENT MONITORING DEVICE

The present specification relates to systems, methods, apparatuses, devices, articles of manufacture and instructions for current monitoring.

SUMMARY

According to an example embodiment, a current monitoring device, comprising: a sense impedance configured to receive a current to be monitored; an impedance divider, coupled to the sense impedance, and configured to convert the current to be monitored to a differential voltage to be monitored; a reference circuit configured to generate a differential reference voltage; a comparator coupled to the impedance divider and the reference circuit and configured to output a signal if the differential voltage to be monitored is different than the differential reference voltage; and wherein the reference circuit includes a comparator trimming circuit configured to vary the differential reference voltage to compensate for offset biases in the comparator.

In another example embodiment, the sense impedance is a resistor; and the impedance divider is a resistive voltage divider.

In another example embodiment, the current to be monitored is a DC current; and the differential voltage to be monitored is less than a DC voltage across the resistor generated in response to the current to be monitored.

In another example embodiment, the sense impedance is an inductor; and the impedance divider is a resistive and capacitive voltage divider.

In another example embodiment, the current to be monitored is an AC current; and an amplitude of the differential voltage to be monitored is less than an amplitude of an AC voltage across the inductor generated in response to the current to be monitored.

In another example embodiment, the comparator trimming circuit is coupled to a voltage reference; and the comparator trimming circuit includes a set of variable resistors configured to adjust a voltage offset between a first and second polarity of the differential reference voltage to compensate for the offset in the comparator.

In another example embodiment, the impedance divider includes a trimming circuit configured to vary a set of impedance elements within the impedance divider to compensate for component mismatch in the impedance divider.

In another example embodiment, the reference circuit includes a monitoring threshold/level trimming circuit configured to vary a magnitude of the differential reference voltage; the magnitude of the differential reference voltage corresponds to a maximum permitted magnitude of the current to be monitored; and the comparator is configured to generate an output signal if the current to be monitored exceeds the maximum permitted magnitude.

In another example embodiment, further comprising a set of protection circuitry coupled to the comparator; wherein the protection circuitry is configured to protect a set of additional circuits in response to receiving the output signal.

In another example embodiment, the comparator is configured to output an over-current signal if the differential voltage to be monitored is greater than the differential reference voltage.

In another example embodiment, the comparator is configured to output an under-current signal if the differential voltage to be monitored is less than the differential reference voltage.

In another example embodiment, the comparator is a differential comparator.

In another example embodiment, further comprising a current polarity selection circuit coupled between the impedance divider and the comparator.

In another example embodiment, the polarity selection circuit is configurable into a first state ($\varphi 0$) that enables the comparator to monitor current flowing through the sense impedance in a first direction.

In another example embodiment, the polarity selection circuit is configurable into a second state ($\varphi 1$) that enables the comparator to monitor current flowing through the sense impedance in a second direction that is opposite to the first direction.

In another example embodiment, further comprising a set of USB adaptors; wherein a first USB adaptor is coupled to one end of the sense impedance; and wherein a second USB adaptor is coupled to another end of the sense impedance.

In another example embodiment, further comprising a set of powered devices; wherein a first powered device coupled to one end of the sense impedance; and wherein a second powered device coupled to another end of the sense impedance.

In another example embodiment, the first powered device is a power supply and the second powered device is a load.

In another example embodiment, the current monitoring device is a first current monitoring device; and the first current monitoring device is coupled to a USB-Type C power/data path; further comprising a second current monitoring device; wherein the second current monitoring device is coupled to the USB-Type C power/data path.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
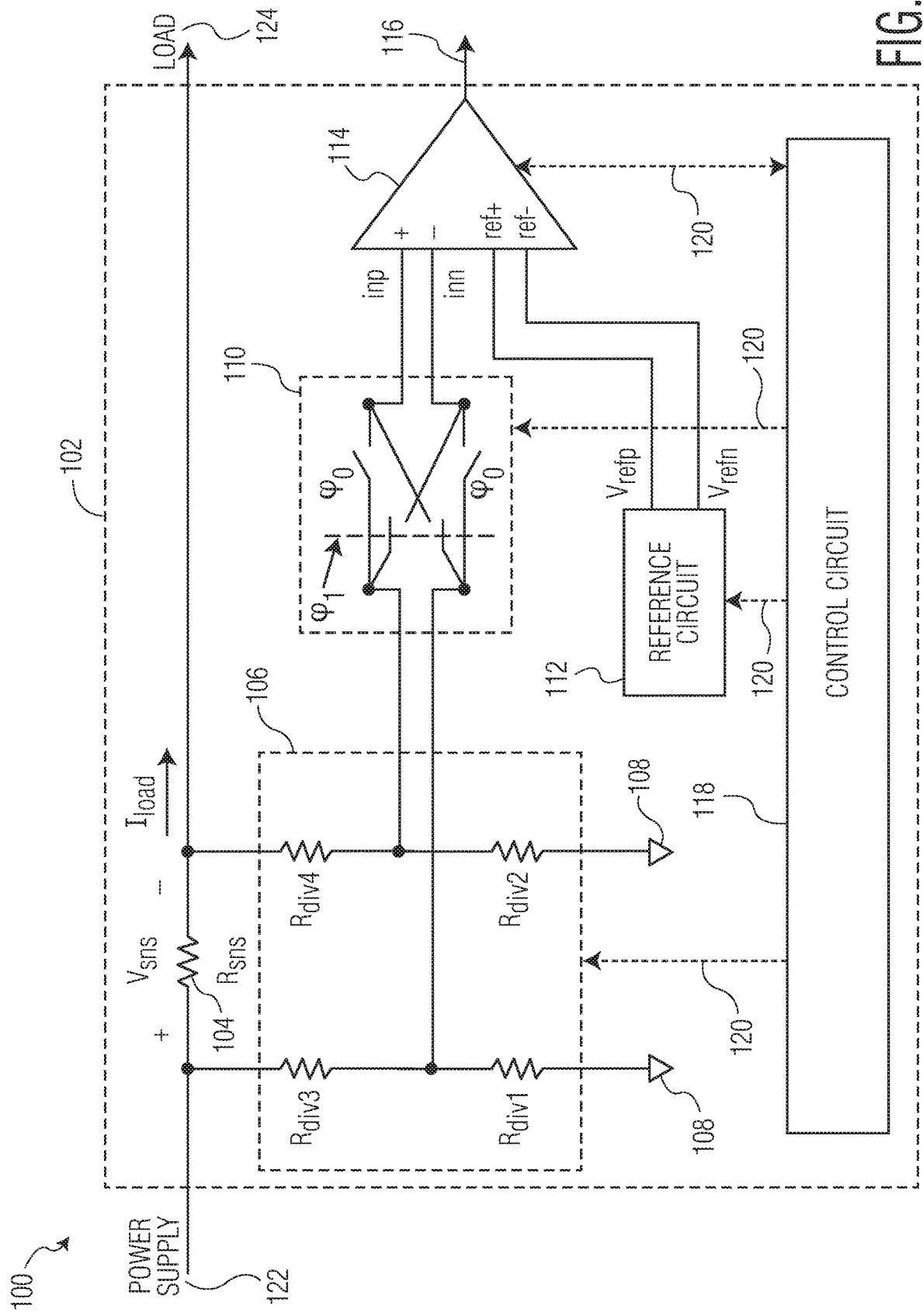
FIG. 1 is a first example of a current monitoring device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Current monitoring (e.g. for the purposes of over-current or under-current protection in some examples) is becoming a necessary function for many powered devices. For example, USB PD (power-data) protocols require some form of over-current protection to be implemented between a power supply (e.g. VBUS (Bus Voltage) source) and a load (e.g. a smartphone).

However, devices either can only protect one direction of the current or require special extended drain device when dealing with high voltage input. For example, some devices are capable of 5 V operation relating to USB signaling. But these devices cannot directly work with 20-30 V as in USB PD standards.

Other high-current and/or high-voltage monitoring systems require high voltage comparators interfacing directly with the high voltage or current line, requiring special high voltage devices for the comparator. These designs also can only sense or protect current in one direction since they may use a replica sensing current from a mains branch with reference to ground, which prevents their use with bidirectional current systems.

Now discussed is a current monitoring circuit, which can with high accuracy, and over a relatively high voltage range, monitor and/or protect circuits sourcing and/or sinking currents.

The discussion below presents circuits for bidirectional current monitoring in a high voltage domain without requiring high voltage transistors. High voltage is herein defined as relative to an application device's operating range (e.g. 5V to 30 V) as compared to the current monitoring circuit's operating range (e.g. 1V to 5V for example).

Using the current monitoring circuit's discussed below, use of a super accurate ADC (Analog to Digital Converter) is no longer necessary in some applications.

In some example embodiments, the current monitoring device now presented is embedded in a data communications bus, such as a USB Type-C, USB PD (power/data), and/or FSK (i.e. Frequency Shift Keying) protocol based communication and/or power delivery.

FIG. 1 is a first example 100 of a current monitoring device 102. The first example 100 current monitoring device 102 includes a sense resistor 104 (Rsns), a voltage divider 106, a reference potential 108 (e.g. ground), a current polarity selection circuit 110 (φ0 control line, φ1 control line), a reference circuit 112, a differential comparator 114 having an output 116, and a control circuit 118 having control lines 120.

The sense resistor 104 (Rsns) in this example 100 is coupled at one end to a DC power supply 122, which could alternately be a first power device or a first port (e.g. USB), and is coupled at another end to a DC load 124, which could alternately be a second power device or a second port (e.g. USB).

The power supply 122 and the load 124 operate as a relatively high voltage. While the power supply 122 and the load 124 are discussed in this example embodiment, in other example embodiments these 122, 124 could be replaced with the first power device and the second power device (introduced above), where these first and second devices can be either or both current source or current sink devices.

The sensing resistor 104 converts the current to be monitored to a differential sense voltage. In other words, the current Iload is sensed using the sense resistor 104 (Rsns) that is inserted in series between the power supply 122 and the load 124, and converts the current Iload to a voltage difference Vsns across the resistor. In one example Rsns resistance is about 20 mOhms and Iload can reach 3-5 Amps.

The voltage divider 106 scales the sensed voltage, using Rdiv1, Rdiv2, Rdiv3 and Rdiv4, to a lower voltage operation range for the rest of the current monitoring device's 102 circuitry. The current Iload is translated to the differentially equivalent voltage at lower common voltage between inp (input positive) and inn (input negative) coupled to the comparator 114. Scaling is an improvement over circuits that require special high voltage switches, comparators, and such. Thus, the current monitoring device 102 can receive a differential sense voltage at high common voltage and process the differentially equivalent voltage at lower common voltage.

The current polarity selection circuit 110 (φ0 control line, φ1 control line) enables the control circuit 118 using the control lines 120 to select a current sensing direction. The current polarity selection circuit 110 enables bidirectional current monitoring.

The current polarity selection circuit 110 operates at a low voltage and has at least two phases (i.e. states) (φ0 and φ1). One phase/state (φ0) monitors current flowing from the load 124 to the power supply 122, the second phase/state (φ1) monitors current flowing from the power supply 122 to the load 124.

The differential comparator 114 receives the differentially equivalent voltage (inp and inn) at a lower common voltage within the device tolerance from the polarity selection circuit 110, and also receives a differential reference voltage (Vrefp and Vrefn) from the reference circuit 112.

The differential comparator 114 output a signal if the differential voltage to be monitored is different than the differential reference voltage (e.g. determining whether the Iload current is over or under a predetermined current limit). "Different than" is herein defined to in some example embodiments require the "difference" exceed a predetermined tolerance range that does not trigger the output signal if the "difference" is within such tolerance range.

In some example embodiments, the comparator 114 is configured to output an over-current signal if the differential voltage to be monitored is greater than the differential reference voltage. In other example embodiments, the comparator 114 is configured to output an under-current signal if the differential voltage to be monitored is less than the differential reference voltage.

By using the differential comparator 114 instead of traditional single ended comparator, common mode signal errors based on temperature, voltage, process variations, and the like can be removed from the comparison. Without differential comparator 114, such common mode signal errors could affect current monitoring accuracy by up to 0.1% to 1%, which can be much greater than a total system accuracy target.

The high accuracy of the differential reference voltage received from the reference circuit 112 enables high accuracy current monitoring through the sense resistor 104 (Rsns). High accuracy of the differential reference voltage is achieved by one or more trimmings of the differential comparator 114, the voltage divider 106, and the reference circuit 112. Examples of these trimmings are further discussed in FIG. 2.

Figure 2:
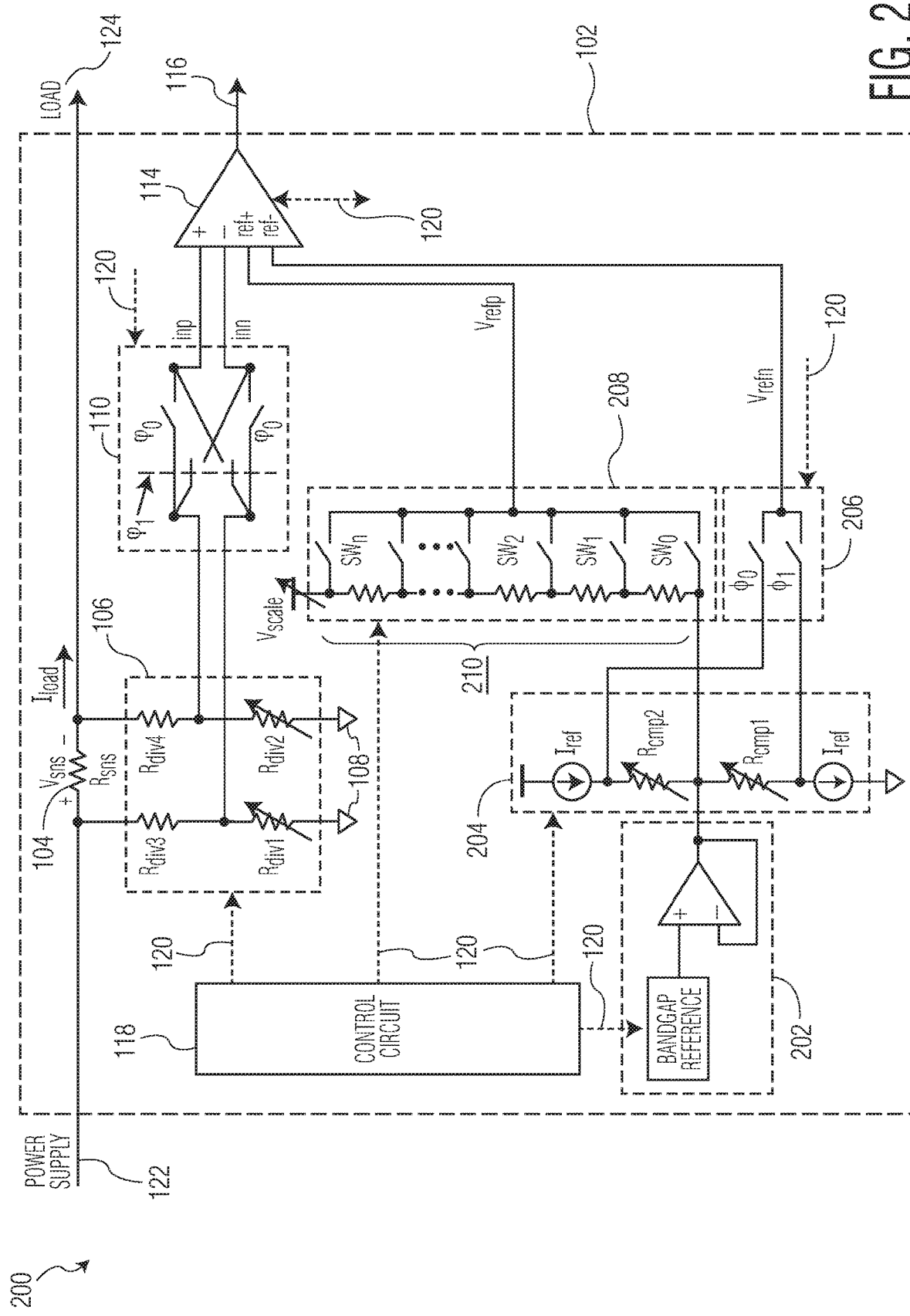
FIG. 2 is a second example of the current monitoring device.

FIG. 2 is a second example 200 of the current monitoring device 102. The second example 200 includes the overall elements of the first example 100; however in the second example 200 the voltage divider 106 now has two adjustable resistors Rdiv1 and Rdiv2, and additional reference circuit 112 (dotted lines enclosing the reference circuit 112 not included to simplify the Figure) elements are added. Specifically, the reference circuit 112 includes a reference voltage circuit 202, a comparator trimming circuit 204, a comparator trimming polarity circuit 206, a threshold selection circuit 208, and a threshold resistor divider circuit 210.

Each of the above elements are controlled and send data to the control circuit 118 via the control lines 120. The control circuit 118 uses the control lines 120 to control, monitor, and trim the differential comparator 114, the voltage divider 106, the reference circuit 112.

Differential comparator 114 trimming, voltage divider 106 trimming, and comparator threshold (Vrefp–Vrefn) trimming are now discussed. Note that in some example embodiments just one of these three trimmings is affected. In other example embodiments, more than one is affected. Furthermore, in some example embodiments all three of these trimmings are affected in the following order: comparator trimming first, divider trimming second, and threshold trimming third.

Differential comparator 114 trimming refers to trimming (i.e. tuning) the differential comparator 114 to minimize offset/mismatch biases. In some example embodiments, should the comparator 114 be selected as one having a low offset architecture (e.g. includes a chopper and/or auto-zeroing) then the comparator trimming discussed below can be skipped.

To begin, the control circuit 118 activates the reference voltage circuit 202. The reference voltage circuit 202 includes a bandgap reference and a unity gain buffer, shown in FIG. 2. The reference voltage circuit 202 provide a voltage reference to the reference circuit 112.

Current sources Iref and variable resistors Rcmp1 and Rcmp2, in the comparator trimming circuit 204, and φ0 and φ1, in the comparator trimming polarity circuit 206, are all used by the control circuit 118 to perform differential comparator 114 trimming.

To trim the comparator 114, first, the control circuit 118 shorts inp and inn together by closing the switches controlled by φ0 and φ1 in the current polarity selection circuit 110.

Second, sw0 in the threshold selection circuit 208 (at the bottom) is closed.

Third, a trimming polarity is selected by the control circuit 118 using φ0 and φ1 in the comparator trimming polarity circuit 206. This sets Vrefn as either greater or less than Vrefp. φ0 and φ1 changes polarity from positive to negative offset, so the equivalent offset/mismatch of comparator 114 could be trimmed in either direction.

Fourth, the comparator's 114 offset/mismatch is then compensated for by adjusting a voltage/IR drop using either Iref & Rcmp1 or Iref & Rcmp2.

Note that this differential comparator 114 trimming does not operate directly on the comparator 114, but instead adjusts Vrefp and Vrefn sent to the comparator 114.

Voltage divider 106 trimming cancels/balances any resistor offsets/mismatches between Rdiv1, Rdiv2, Rdiv3 and Rdiv4. In the example embodiment shown in FIG. 2, only Rdiv1 or Rdiv2 are variable resistors used for this trimming and are connected to the control circuit 118 via the control lines 120.

Since the offsets/mismatches scale with voltage, the control circuit 118 either requests or waits until the power supply 122 is at a relatively high or maximum voltage before the voltage divider 106 is trimmed.

In some example embodiments, the voltage divider 106 trimming is done after the comparator 114 is trimmed or by monitoring the inp (input positive) and inn (input negative) voltages using separate sense lines (not shown) sent to the control circuit 118.

Threshold/level trimming refers to adjusting Vrefp at the output of the threshold selection circuit 208 with respect to Vrefn at the output of the comparator trimming polarity circuit 206.

The control circuit 118 opens and closes switches SW0 through SWn to vary Vrefp. The current monitoring threshold is set by the difference between Vrefp and Vrefn.

In some example embodiments, when the current monitoring threshold is exceeded, the comparator 114 generates a signal on the output 116. This output 116 signal can then trigger additional circuit or system protection circuitry and/or protocols (not shown) to prevent damage to such circuit or system.

A maximum monitored current threshold is set by Vscale at the top of the resistive ladder in the threshold selection circuit 208.

Using these three trimmings, the current between first and second power devices (e.g. the power supply 122 and the load 124) can be monitored with a high accuracy. For example, in some example embodiments a voltage accuracy across the sense resistor 104 (Rsns=20 mΩ) is about 10-15 mV for a current monitoring accuracy of about 0.5 A-0.75 A. Even if the power supply 122 output is 25 V, the accuracy of the current monitoring device 102 would still be about 400-600 ppm.

Figure 3:
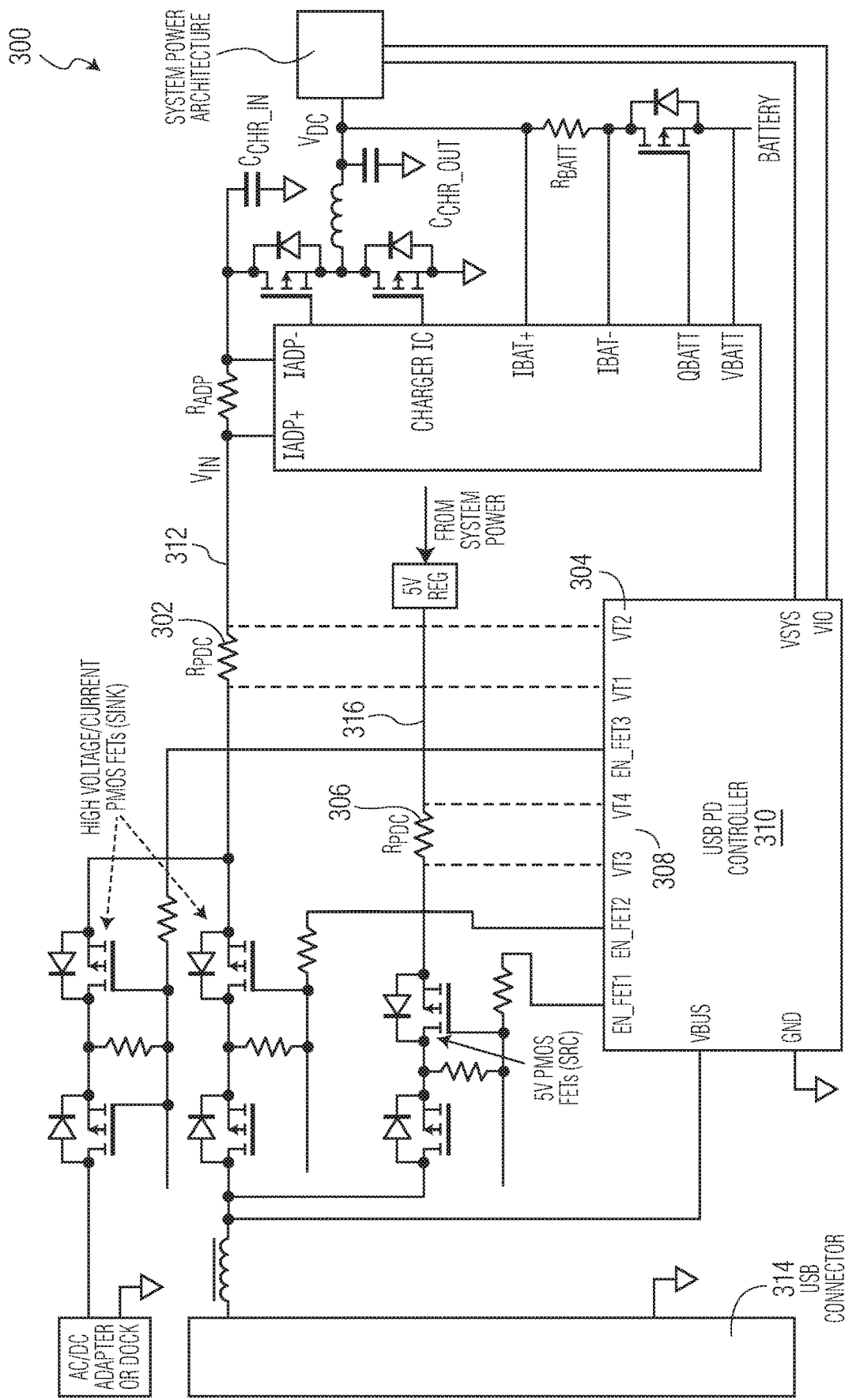
FIG. 3 is an embedded example of the current monitoring device.

FIG. 3 is an embedded example 300 of the current monitoring device 102. The example 300 includes a first current monitoring device (not explicitly shown) that has a first sense resistor 302 (Rsns) and a remainder of circuit 304 (connected to VT1 and VT2 pins), and a second current monitoring device (not explicitly shown) that has a second sense resistor 306 (Rsns) and a remainder of circuit 308 (connected to VT3 and VT4 pins).

Here the remainder of circuit 304 of the first current monitoring device and the remainder of circuit 308 of the second current monitoring device are substantially embedded in a USP PD Controller 310.

The first sense resistor 302 is located in a first path 312 coupled to a USB adaptor 314, and is also coupled to the remainder of circuit 304 (i.e. VT1 and VT2). The second sense resistor 306 is located in a second path 316 coupled to the USB adaptor 314, and is also coupled to the remainder of circuit 308 (i.e. VT3 and VT4). The sense resistors 302, 306 are configured to monitor the currents in these two paths 312, 316.

Figure 4:
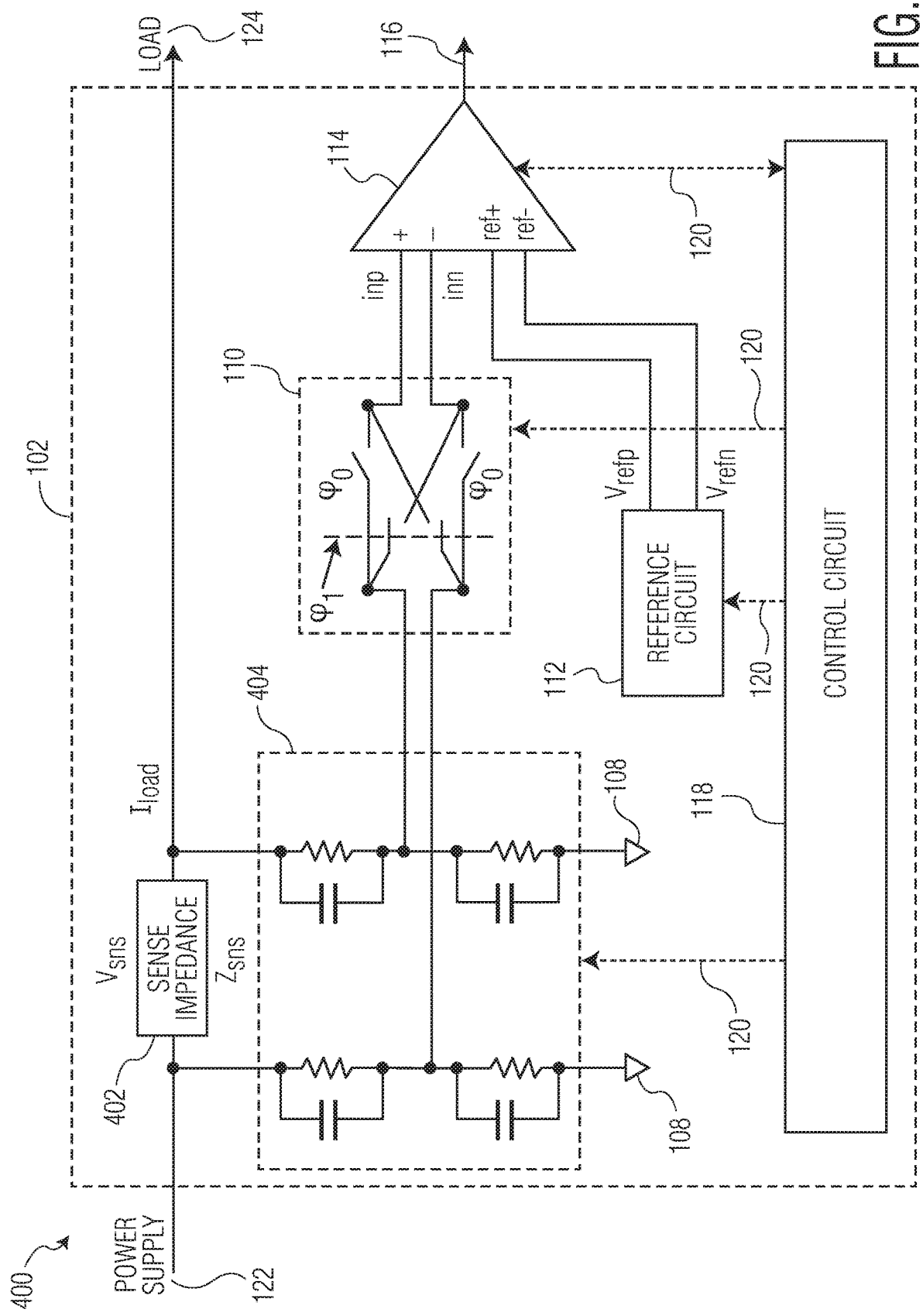
FIG. 4 is a third example of the current monitoring device.

FIG. 4 is a third example 400 of the current monitoring device 102. The example 400 current monitoring device 102 includes a sense impedance 402 (Zsns), an impedance divider 404, a reference potential 108 (e.g. ground), a current polarity selection circuit 110 (φ0 control line, φ1 control line), a reference circuit 112, a differential comparator 114 having an output 116, and a control circuit 118 having control lines 120.

The sense impedance 402 in this example 400 is coupled at one end to an AC power supply or DC power supply with fast transient current 122 and is coupled at another end to an AC load or a load with fast transient current behavior 124.

The third example 400 of the current monitoring device 102 operates in a substantially similar manner to the first example 100 of the current monitoring device 102 discussed above, with the following exceptions.

The sensing impedance 402 can be either a resistor or an inductor. The impedance divider 404 includes additional capacitive elements in parallel with the divider's resistors. The comparator 114 is preferably a "high speed" comparator that can have a small delay (e.g. a few nano-seconds). Such a configuration is suitable for fast varying/transient current monitoring. It can be applied for monitoring of AC current peak value, loading transient, unintentional current spikes. Capacitors in the divider can be removed and the "high speed" comparator can be replaced with a lower speed version if the current monitoring device 102 is applied for monitoring of average AC current.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A current monitoring device, comprising:
a sense impedance configured to receive a current to be monitored;
an impedance divider, coupled to the sense impedance, and configured to convert the current to be monitored to a differential voltage to be monitored;
a reference circuit configured to generate a differential reference voltage;
a comparator coupled to the impedance divider and the reference circuit and configured to output a signal if the differential voltage to be monitored is different than the differential reference voltage; and
wherein the reference circuit includes a comparator trimming circuit configured to vary the differential reference voltage to compensate for offset biases in the comparator.

2. The device of claim 1:
wherein the sense impedance is a resistor; and
wherein the impedance divider is a resistive voltage divider.

3. The device of claim 2:
wherein the current to be monitored is a DC current; and
wherein the differential voltage to be monitored is less than a DC voltage across the resistor generated in response to the current to be monitored.

4. The device of claim 1:
wherein the sense impedance is an inductor; and
wherein the impedance divider is a resistive and capacitive voltage divider.

5. The device of claim 4:
wherein the current to be monitored is an AC current; and
wherein an amplitude of the differential voltage to be monitored is less than an amplitude of an AC voltage across the inductor generated in response to the current to be monitored.

6. The device of claim 1:
wherein the comparator trimming circuit is coupled to a voltage reference; and
wherein the comparator trimming circuit includes a set of variable resistors configured to adjust a voltage offset between a first and second polarity of the differential reference voltage to compensate for the offset in the comparator.

7. The device of claim 1:
wherein the impedance divider includes a trimming circuit configured to vary a set of impedance elements within the impedance divider to compensate for component mismatch in the impedance divider.

8. The device of claim 1:
wherein the reference circuit includes a monitoring threshold/level trimming circuit configured to vary a magnitude of the differential reference voltage;

wherein the magnitude of the differential reference voltage corresponds to a maximum permitted magnitude of the current to be monitored; and wherein the comparator is configured to generate an output signal if the current to be monitored exceeds the maximum permitted magnitude.

9. The device of claim 8:
wherein the output signal of the comparator is configured to be coupled to a set of protection circuitry;
wherein the protection circuitry is configured to protect a circuit in response to receiving the output signal.

10. The device of claim 1:
wherein the comparator is configured to output an over-current signal if the differential voltage to be monitored is greater than the differential reference voltage.

11. The device of claim 1:
wherein the comparator is configured to output an under-current signal if the differential voltage to be monitored is less than the differential reference voltage.

12. The device of claim 1:
wherein the comparator is a differential comparator.

13. The device of claim 1:
further comprising a current polarity selection circuit coupled between the impedance divider and the comparator.

14. The device of claim 13:
wherein the polarity selection circuit is configurable into a first state ($\varphi 0$) that enables the comparator to monitor current flowing through the sense impedance in a first direction.

15. The device of claim 14:
wherein the polarity selection circuit is configurable into a second state ($\varphi 1$) that enables the comparator to monitor current flowing through the sense impedance in a second direction that is opposite to the first direction.

16. The device of claim 1:
further comprising a set of USB adaptors;
wherein a first USB adaptor is coupled to one end of the sense impedance; and
wherein a second USB adaptor is coupled to another end of the sense impedance.

17. The device of claim 1:
further comprising a set of powered devices;
wherein a first powered device coupled to one end of the sense impedance; and
wherein a second powered device coupled to another end of the sense impedance.

18. The device of claim 17:
wherein the first powered device is a power supply and the second powered device is a load.

19. The device of claim 1:
wherein the current monitoring device is a first current monitoring device; and
wherein the first current monitoring device is coupled to a USB-Type C power/data path;
further comprising a second current monitoring device;
wherein the second current monitoring device is coupled to the USB-Type C power/data path.

20. A current monitoring device, comprising:
a sense impedance configured to receive a current to be monitored;
an impedance divider, coupled to the sense impedance, and configured to convert the current to be monitored to a differential voltage to be monitored;
a reference circuit configured to generate a differential reference voltage;
a comparator coupled to the impedance divider and the reference circuit and configured to output a signal if the differential voltage to be monitored is different than the differential reference voltage;
wherein the reference circuit includes a comparator trimming circuit configured to vary the differential reference voltage to compensate for offset biases in the comparator;
wherein the comparator trimming circuit is coupled to a voltage reference;
wherein the comparator trimming circuit includes a set of variable resistors configured to adjust a voltage offset between a first and second polarity of the differential reference voltage to compensate for the offset in the comparator;
wherein the reference circuit includes a monitoring threshold/level trimming circuit configured to vary a magnitude of the differential reference voltage;
wherein the magnitude of the differential reference voltage corresponds to a maximum permitted magnitude of the current to be monitored; and
wherein the comparator is configured to generate an output signal if the current to be monitored exceeds the maximum permitted magnitude.

* * * * *